(12) United States Patent
Fukahori

(10) Patent No.: US 9,362,864 B2
(45) Date of Patent: Jun. 7, 2016

(54) DYNAMIC GEARSHIFT DURING OSCILLATOR BUILD-UP BASED ON DUTY CYCLE

(71) Applicant: GainSpan Corporation, San Jose, CA (US)

(72) Inventor: Kiyoshi Fukahori, San Jose, CA (US)

(73) Assignee: GAINSPAN CORPORATION, San Jose, CA (US)

( * ) Notice: Subject to any disclaimer, the term of this patent is extended or adjusted under 35 U.S.C. 154(b) by 0 days.

(21) Appl. No.: 14/483,128

(22) Filed: Sep. 10, 2014

(65) Prior Publication Data

US 2016/0072438 A1      Mar. 10, 2016

(51) Int. Cl.
*H03B 5/36*      (2006.01)
*H03B 5/04*      (2006.01)
*H03B 5/06*      (2006.01)

(52) U.S. Cl.
CPC ............ *H03B 5/364* (2013.01); *H03B 5/06* (2013.01); *H03B 2200/0094* (2013.01)

(58) Field of Classification Search
CPC .... H03B 5/36; H03B 5/06; H03B 2200/0062; H03B 2200/0094

USPC ............... 331/116 R, 116 FE, 158, 173, 183
See application file for complete search history.

(56) References Cited

U.S. PATENT DOCUMENTS

| | | | |
|---|---|---|---|
| 7,030,709 B2 * | 4/2006 | Novac | 331/158 |
| 7,123,109 B2 * | 10/2006 | Stevenson et al. | 331/109 |
| 7,348,861 B1 * | 3/2008 | Wu et al. | 331/158 |
| 7,683,730 B2 * | 3/2010 | Cetin et al. | 331/186 |
| 8,120,439 B2 * | 2/2012 | Shrivastava et al. | 331/160 |
| 8,816,786 B2 * | 8/2014 | Tham | 331/109 |

* cited by examiner

*Primary Examiner* — Ryan Johnson
(74) *Attorney, Agent, or Firm* — Seyfarth Shaw LLP; Puya Partow-Navid

(57) ABSTRACT

A dynamic gearshifting system includes a monitoring device configured to monitor a duty cycle of a clock output signal of a crystal oscillator circuit during oscillation buildup upon power-up of the crystal oscillator circuit. The dynamic gearshifting system also includes a detecting device configured to detect whether the duty cycle of the clock output signal of the crystal oscillator circuit meets a duty cycle threshold value. The dynamic gearshifting system may further include an assertion device configured to assert a control signal based on detecting the duty cycle meets the duty cycle threshold value. The asserted control signal configured to dynamically adjust a transconductance of the crystal oscillator circuit.

18 Claims, 9 Drawing Sheets

DYNAMIC GEARSHIFT DURING OSCILLATOR BUILD-UP BASED ON DUTY CYCLE

BACKGROUND

1. Field

Aspects of the present disclosure relate to crystal oscillators, and more particularly to method and system for dynamic gearshift during oscillation buildup by monitoring a duty cycle of an output of the crystal oscillator.

2. Background

Due to the inherent characteristics of certain crystals, they can be made to oscillate at a very precise frequency. Thus, crystal controlled oscillators are often used in applications where a precise frequency is required.

The crystal and its associated active circuitry together constitute a crystal oscillator. They form, in effect, a lossless inductor (L) capacitor (C) LC tank circuit that oscillates at a resonant frequency dictated by the values of the inductor and the capacitor.

Crystal oscillator circuits operate by virtue of positive feedback at or the near the resonant frequency of the crystal. The positive feedback is provided by an active circuit that poses, in effect, a negative impedance to the crystal. When power is initially applied to a crystal oscillator circuit, a large negative impedance effected by the active circuit overcomes the loss associated with the resistance (loss) of the crystal. As the amplitude builds up toward the final steady state at a frequency very close to the resonant frequency of the LC tank, the negative impedance created by the active circuit begins to diminish until it just matches the resistance of the crystal. Ultimately, it settles at precisely the resonant frequency of the LC tank. In other words, the loss encountered in the crystal is compensated for by the active circuit so that the oscillation can be sustained.

In some applications, the amount of time required to power up and stabilize an oscillator may be longer than desirable. Accordingly, for these applications it is desirable to reduce the time required to power up and stabilize the oscillator.

SUMMARY

According to one aspect of the present disclosure, an apparatus includes a monitoring device configured to monitor a duty cycle of a clock output signal of a crystal oscillator circuit during oscillation buildup upon power-up of the crystal oscillator circuit. The apparatus also includes a detecting device configured to detect whether the duty cycle of the clock output signal of the crystal oscillator circuit meets a duty cycle threshold value. Further, the apparatus includes an assertion device configured to assert a control signal based on detecting if the duty cycle meets the duty cycle threshold value. The asserted control signal is configured to dynamically adjust a transconductance of one or more transistors in the crystal oscillator circuit.

According to one aspect of the present disclosure, a method includes monitoring a duty cycle of a clock output signal of a crystal oscillator circuit during oscillation buildup upon power-up of the crystal oscillator circuit. The method also includes detecting whether the duty cycle of the clock output signal of the crystal oscillator circuit meets a duty cycle threshold value. Further, the method includes asserting a control signal based on detecting if the duty cycle meets the duty cycle threshold value. The asserted control signal is configured to dynamically adjust a transconductance of one or more transistors in the crystal oscillator circuit.

According to one aspect of the present disclosure, an apparatus includes means for monitoring a duty cycle of a clock output signal of a crystal oscillator circuit during oscillation buildup upon power-up of the crystal oscillator circuit. The apparatus also includes means for detecting whether the duty cycle of the clock output signal of the crystal oscillator circuit meets a duty cycle threshold value. Further, the apparatus includes means for asserting a control signal based on detecting if the duty cycle meets the duty cycle threshold value. The asserted control signal is configured to dynamically adjust a transconductance of one or more transistors in the crystal oscillator circuit.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Overview

The present disclosure describes a method and system for automatic or dynamic gearshifting during oscillation buildup of a crystal oscillator by monitoring a duty cycle of a buffer output of a crystal oscillator circuit. Gearshifting during oscillation buildup in accordance with an aspect of the present disclosure reduces time required for the output of the crystal oscillator to settle to a final steady state as well as current consumed by the crystal oscillator.

Crystal Oscillator

Figure 1:
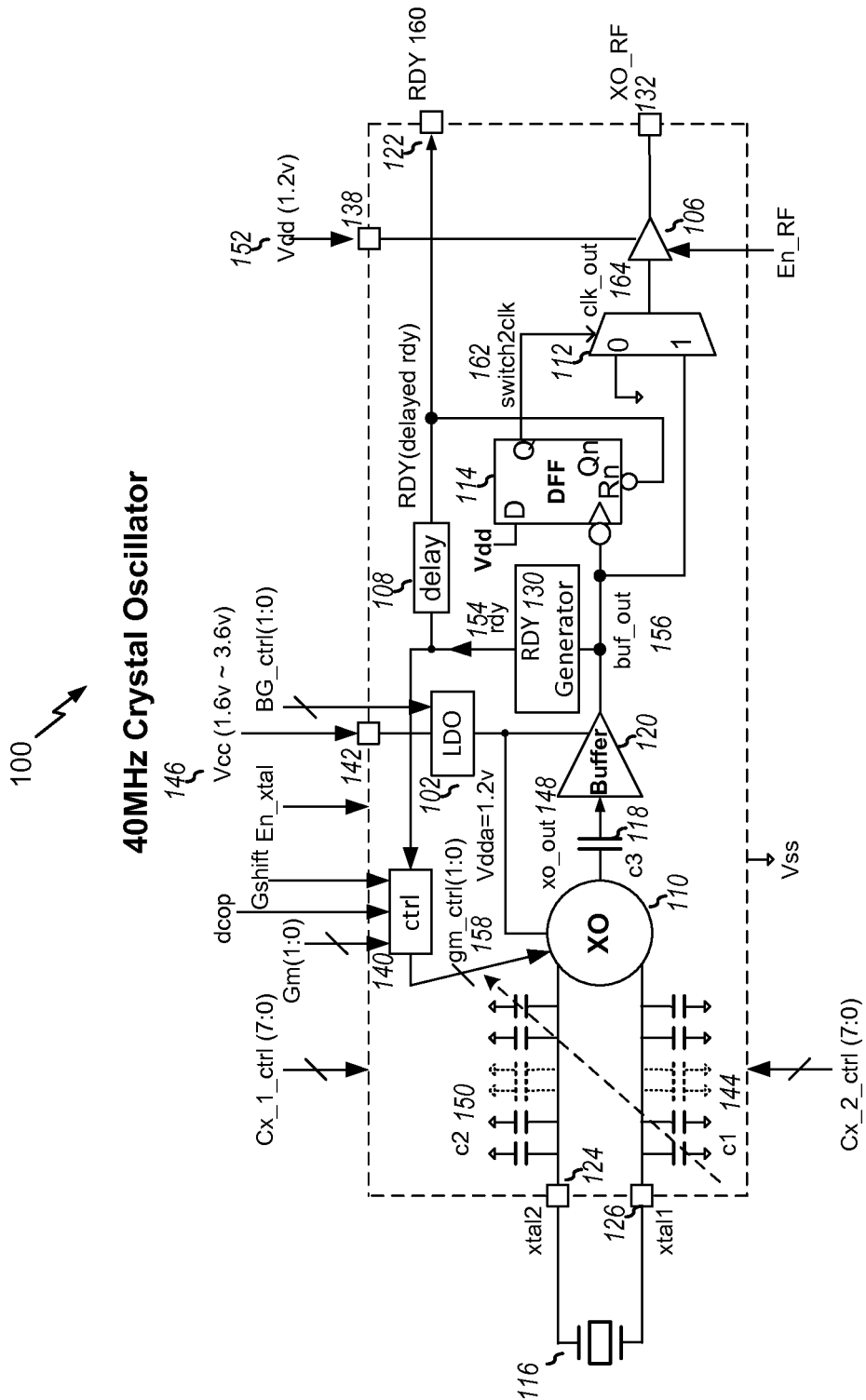
FIG. 1 illustrates an exemplary crystal oscillator circuit according to one or more aspects of the present disclosure.

FIG. 1 illustrates an exemplary crystal oscillator circuit 100 according to one or more aspects of the present disclosure.

In one aspect, the crystal oscillator circuit may be a 40 megahertz (MHz) crystal oscillator that is implemented in a radio access technology processor/controller, such as a wireless local area network (WLAN) chip. Although the crystal oscillator in the present disclosure is implemented in a WLAN chip, the crystal oscillator may be implemented in other radio access technologies such as Long Term Evolution, Worldwide Interoperability for Microwave Access, etc. For example, the reading material may include magazines, articles, electronic publications etc. The crystal oscillator circuit 100 may include a crystal oscillator (XO) core 110, a buffer 120 that converts a sinusoidal output from the XO core 110 to a square wave, a control signal generator, such as a RDY Generator 130, a set of logic devices and an output driver. The RDY generator 130 is a ready to operate and use generator. The set of capacitors, c1 144 and c2 150, may be within or external to the XO core 110. The crystal oscillator also includes a low drop out (LDO) regulator 102 to drive the XO core 110 and the buffer 120. The LDO regulator 102 receives an external supply voltage, Vcc, through a terminal 142.

In one aspect, an output voltage of the LDO regulator 102 is about 1.2 volts (v). The LDO 102 provides immunity to the external voltage supply, Vcc 146, which allows Vcc 146 to be unregulated or noisy. An output signal, xo_out 148 from the XO core 110 is ac-coupled to the buffer 120 via a capacitor (c3) 118. In one aspect of the disclosure, the external supply voltage, Vcc 146, ranges from 1.6v to 3.6v. A digital core voltage, Vdd 152, generated within the radio access technology chip is provided to the crystal oscillator circuit 100 at terminal 138, for example. The digital core voltage, Vdd 152, powers the output driver 106, among others, in the crystal oscillator circuit 100.

In some aspects of the present disclosure, the proposed method and system for automatic gearshift during the crystal oscillator buildup may be implemented at least in part within the buffer 120 and the RDY Generator 130. In this aspect, an output signal, rdy signal 154, is generated by the RDY generator 130 when a duty cycle of an output signal, buf_out signal 156, from the buffer 120 meets a threshold value or is above the threshold value (e.g., >40%). Because the amount of time to power up and stabilize the crystal oscillator circuit 100 is of concern to some applications, aspects of the present disclosure seek to reduce the amount of time required to initiate the stable operation of the crystal oscillator circuit 100. In one aspect, the initiation of the stable operation of the crystal oscillator circuit 100 is based on an assertion of the rdy signal 154 generated by the RDY generator 130.

The duty cycle of the buf_out signal 156 may be monitored by the RDY generator 130. The RDY generator 130 may be configured to generate the rdy signal 154, to control features of the XO core 110. Further, control of the XO core 110 may be based on control signals received at the XO core 110 from a control device 140. For example, the control device 140 may be configured to generate a control signal, gm_ctrl 158, to dynamically adjust a transconductance of one or more transistors in the XO core 110. In one aspect of the present disclosure, the control signal, gm_ctrl 158, may be based on the rdy signal 154 and/or at least one of a combination of control signals received by the control device 140. The combination of control signals may include control signals such as a transconductance, Gm, (e.g., Gm (1,0), a gear shift signal, Gshift and a direct current operating point (dcop). The combination of control signals may be configured to allow gearshift from a high Gm to a lower Gm of the XO core during oscillation buildup to reduce the time for the oscillation to settle to its final steady state. In some aspects, the time for the oscillation to settle to its final steady state is reduced by multiple clock cycles, e.g., one thousand clock cycles.

In one aspect of the disclosure, the buf_out signal 156 is initially conditioned to be low (or high), i.e., the duty cycle is at zero (or 1) upon power-up of the crystal oscillator circuit 100. As oscillation of the crystal 116 builds up in the crystal oscillator circuit 100, the duty cycle of the XO core output signal, xo_out 148, and subsequently the buf_out signal 156 begins to increase (or decrease). The change in the duty cycle or other features of the buf_out signal 156 is continually monitored by the RDY Generator 130. When the duty cycle of the buf_out signal 156 meets or is above the threshold duty cycle value, the RDY Generator 130 asserts a signal, such the rdy signal 154.

Based on the assertion, a control signal that may be the rdy signal 154 or based on the rdy signal 154, is forwarded to an input of a delay block 108 and/or to an input of the control device 140. When a gearshift occurs, there will be some disturbance inevitably created in the XO core 110. The delay introduced herein 108 is meant to shield the disturbance from the rest of the circuit. The rdy signal 154 or a signal based on the rdy signal 154 is delayed at the delay block 108. The output of the delay block, i.e., the delayed rdy, RDY signal 160, is used as a clock for a clock switching operation in a logic device 112, such as a multiplexer, of the set of logic devices in the crystal oscillator circuit 100. In one aspect, the switching operation may be based on an output signal, i.e., switch2clk signal 162, from a D flip flop (DFF) 114 in the crystal oscillator circuit 100. The switch2clk signal 162 is based on the delayed rdy, RDY signal 160, which is forwarded to an input of the DFF 114. The delayed rdy signal, RDY 160, may be measured at a terminal 122 of the crystal oscillator circuit 100. The delayed rdy signal, RDY 160, is used to generate the clock output signal, clk_out signal 164, such that the clk_out signal 164 is free of glitches, as the stable operation of the crystal oscillator circuit is initiated before the oscillator settles to its final state. This feature reduces the amount of time required to initiate the stable operation of the crystal oscillator.

Figure 1A:
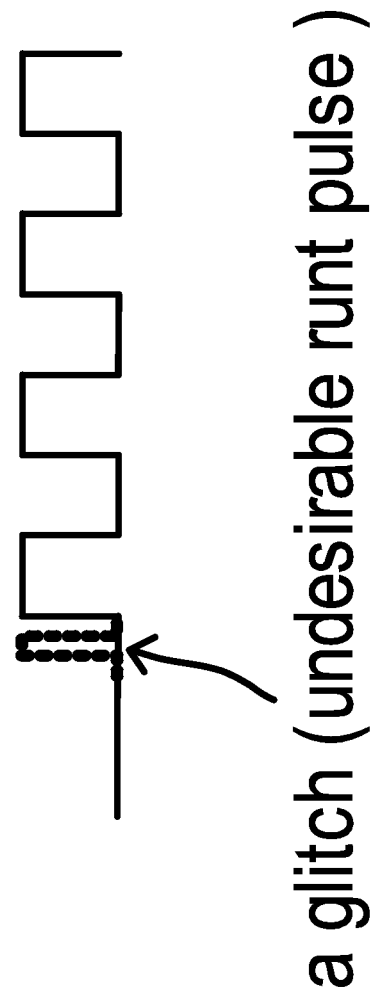
FIG. 1a illustrates exemplary waveform of an output signal including an undesirable runt pulse.

The DFF 114 may be powered by the digital core voltage, Vdd. The output of the DFF 114, i.e., the switch2clk signal 162, may also be based on the buf_out signal 156 received by the DFF 114. The switch2clk signal 162 is forwarded to an input of the logic device 112, and may serve as a control signal for the multiplexer 112. For example, the multiplexer is switched to position "1" when the switch2clk signal 162 is asserted (or high) and is at position "0" when the switch2clk signal 162 is de-asserted (or low). The combined effect of RDY Generator 130, DFF 114, delay block 108 and multiplexer 112 is that the clock seen at XO_RF (132) is free of glitches. The output clock at 132 is initially held at zero and transitions to a clean clock as switch2clk is asserted. If this transition is not properly handled, (i.e., if the switching of multiplexer (mux) is poorly handled) an undesirable runt pulse (glitch) may be included in the output clock 132. The runt pulse, shown in FIG. 1a may cause logic to fail when used in a logic circuit The clk_out signal 164, is forwarded to the output driver 106, which is powered by the digital core voltage Vdd received at terminal 138 of the crystal oscillator circuit 100. The output driver 106 may be enabled or disabled by asserting or de-asserting a radio frequency (e.g., high frequency radio frequency) enable signal, En_RF. The output driver 106 is configured to output a radio frequency crystal oscillator signal, XO_RF signal, based on the clock output signal, clk_out signal 164. The XO_RF signal may be measured at output terminal 132 of the crystal oscillator circuit.

Output Signal Waveforms

Figure 2:
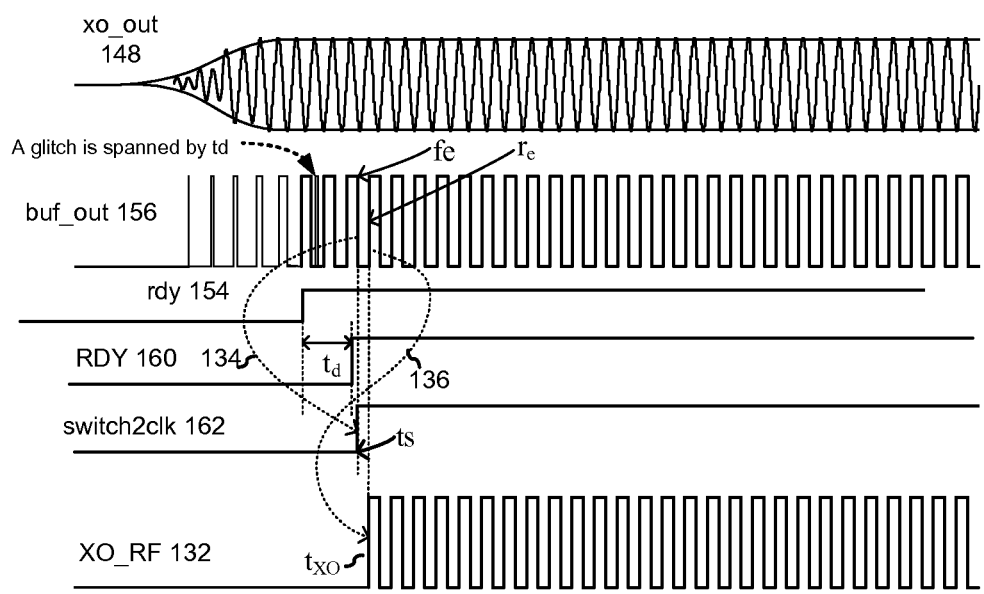
FIG. 2 illustrates exemplary waveforms of output signals at various terminals on the crystal oscillator circuit of FIG. 1 according to one or more aspects of the present disclosure.

FIG. 2 illustrates exemplary waveforms of output signals at various points on the crystal oscillator circuit of FIG. 1 according to one or more aspects of the present disclosure.

The waveforms correspond to the output signal of the XO core 110 (i.e., xo_out signal), the buf_out signal 156, the delayed rdy signal, RDY 160, the switch2clk signal 162 and the XO_RF 132 signal. The horizontal axis of the each waveform corresponds to a time and the vertical axis corresponds to a voltage.

When the crystal oscillator circuit 100 is powered on, the noise inherent in the circuit and/or created by the applied voltage initiates oscillation of the oscillator 100. A capacitance introduced by c1 and c2 resonates with the crystal 116, which acts inductively at a resonant frequency of 40 MHz, for example. Correspondingly, the voltage swing across the terminals 124 and 126 of the crystal 116 increases with time. This is illustrated in the xo_out waveform of FIG. 2.

The rdy signal 154 is based on the output signal, buf_out signal 156, at the buffer 120. The rdy signal 154 is asserted when the duty cycle of the buf_out signal 156 is greater than the duty cycle threshold value. The rdy signal 154 is applied (e.g., immediately) to the control device (ctrl) 140 and causes the XO core to gearshift. A transient that may be caused by the gearshift in the XO core 110 is allowed to settle while the rdy signal 154 is being delayed by the delay block 108 in the amount of $t_d$ seconds. The delay should be long enough to span the transient, as illustrated in FIG. 2.

When the stable operation of the crystal oscillator circuit 100 is indicated at time, $t_d$ seconds after rdy, a clock switching operation is initiated by generating the switch2clk signal 162 at time $t_s$ of the switch2clk waveform corresponding to a next falling edge, $f_e$, of the buf_out waveform. This feature is illustrated by the line 134 of FIG. 2. As noted, the switch2clk signal 162 may be configured to control the logic device/multiplexer 112, which allows the multiplexer to output a clock output signal, clk_out, upon which the XO_RF signal is based. In one aspect of the disclosure, the XO_RF signals is initiated at time, $t_{xo}$, illustrated in the XO_RF waveform at a rising edge, $r_e$, of the buf_out waveform, which follows the falling edge, $f_e$, of the buf_out waveform. This feature is illustrated by the line 136 of FIG. 2.

Crystal Oscillator Core

Figure 3:
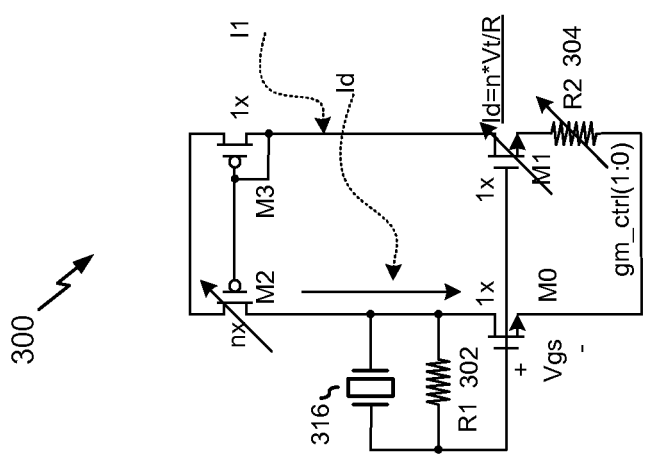
FIG. 3 illustrates an exemplary core of a crystal oscillator according to one or more aspects of the present disclosure.

FIG. 3 illustrates an exemplary crystal oscillator core 300 of a crystal oscillator according to one or more aspects of the present disclosure.

For explanatory purposes, the crystal oscillator core, XO core 300, is shown in a simplified form. The XO core 300 may be similar to the XO core 110 of FIG. 1. The XO core 300 includes a crystal 316, a resistor, R1 302, a variable resistor, R2 304, and a pair of back to back current sources connected together. The current sources may include transistors M0, M1, M2 and M3. The transistor M0 provides a transconductance, gm, for oscillation. The transistors, M0 and M1, are biased in sub-threshold region for optimum transconductance, gm, with low drain current, Id. A dependence of the drain current, Id, on a gate to source voltage, Vgs, of the transistor M0, in sub-threshold region is exponential. In one aspect of the disclosure, the drain current of M1 of the XO core 300 at the onset of oscillation is given by, $$I = n*Vt/R, \text{ where}$$

Vt is the thermal voltage given by kT/q, where k is the Botzmann Constant, T, the absolute temperature, and q, the electronic charge, R2 304 is a degeneration resistor at the source of M1, and n is an effective current density ratio of M0 and M1.

The sizes of transistors M1 and M2 as well as the variable resistor R2 304, may be programmable in two or more steps each to allow for different settings of the transconductance, gm (e.g., 4 different settings). In some aspects, the settings may be more or less than 2. The variable resistance and the sizes of transistors M1 and M2 may be controlled by the control signal from the RDY generator 130 and/or the control signal from the control device 140 of FIG. 1. The control device output signal may be based on rdy signal 154, as well as the combination of control signals that are received by the control device 140. The control signal referred to as gm_ctrl, may be configured to vary or adjust the resistance of the variable resistor R2 304. Varying the resistance of the variable resistor R2 304 and/or the sizes of transistors M1 and M2 varies or adjusts the drain current, I1 at the transistor M1 and the corresponding drain current at the transistor M0. Subsequently, the transconductance, gm, of the transistor M0 is varied or adjusted as a result of the changes to the drain current of the transistors, M1. One advantage of this aspect is that as oscillation builds up, the current consumed by the XO core 300 is automatically reduced until the negative resistance seen by the crystal 316 matches its electrostatic resistance (ESR). The reduction in current consumption (representing the reduction in transconductance, gm, of transistor M0) as oscillation builds up continues until the negative resistance seen across the gate and drain of the transistor M0 is the same as ESR of the crystal 316. In some aspects, the transconductance gm is reduced to an adequate level to overcome the ESR of the crystal 316.

Crystal Oscillator Core Output Waveform

Figure 4:
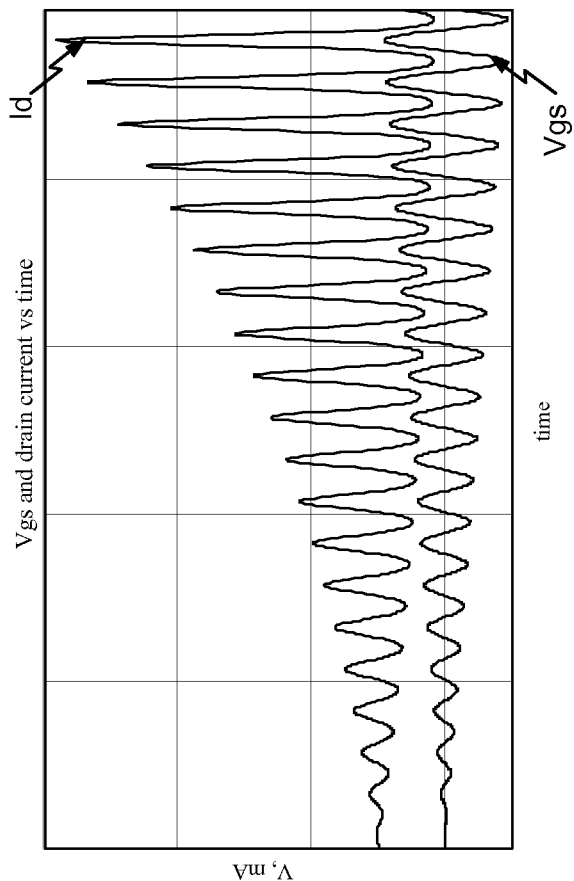
FIG. 4 illustrates exemplary waveforms of out signals at various terminals on the crystal oscillator core of FIG. 3 according to one or more aspects of the present disclosure.

FIG. 4 illustrates exemplary waveforms of output signals at various terminals on the XO core 300 of FIG. 3 according to one or more aspects of the present disclosure.

The horizontal axis of the each waveform corresponds to a time and the vertical axis corresponds to a voltage or a current. The waveforms include a gate to source voltage, Vgs, of the transistor M0 and a drain current, Id, of the transistor M0. When the XO core 300 is powered up, the oscillation builds up from an initial state to a stable state. Initially, M1 conducts a dc current, I1=n*Vt/R, while M0 conducts n*I1. As the oscillation builds up, the gate to source voltage, Vgs, of the transistor M0 induces a growing sinusoidal alternating current riding on a dc current of Id that is initially equal to n*I1. As the oscillation builds up further, the drain current, Id, of the transistor M0 becomes progressively non-linear, and its average direct current becomes smaller. Consequently, the average (direct current) gate to source voltage, Vgs, of the transistor M0 begins to decrease and thus lowers the transconductance, gm, of transistor M0 until the negative resistance introduced by the transistor M0 across its gate and drain matches the ESR of the crystal 316. Because a higher transconductance, gm, corresponds to a faster buildup of the oscillation, it is advantageous to provide a means by which the initial transconductance, gm, is higher or increased (i.e., gearshifted to its highest value, for example) and as the oscillation builds up, the transconductance, gm, is dynamically lowered. Increasing the initial transconductance, gm, and dynamically lowering the transconductance, gm, as the oscillation build up may be facilitated by control signals, such as, gm_ctrl(1:0) that acts on the rdy signal described herein. As noted, the control signals may be configured to control the variable resistor R2 and/or the sizes of transistors M1 and M2 to implement the feature of increasing the initial transconductance, gm, and dynamically lowering the transconductance, gm, as the oscillation builds up. Increasing the initial transconductance, gm, and dynamically lowering the transconductance, gm, further reduces the amount of time required to initiate the stable operation of the crystal oscillator circuit 100.

Startup Crystal Oscillator Circuit

Figure 5:
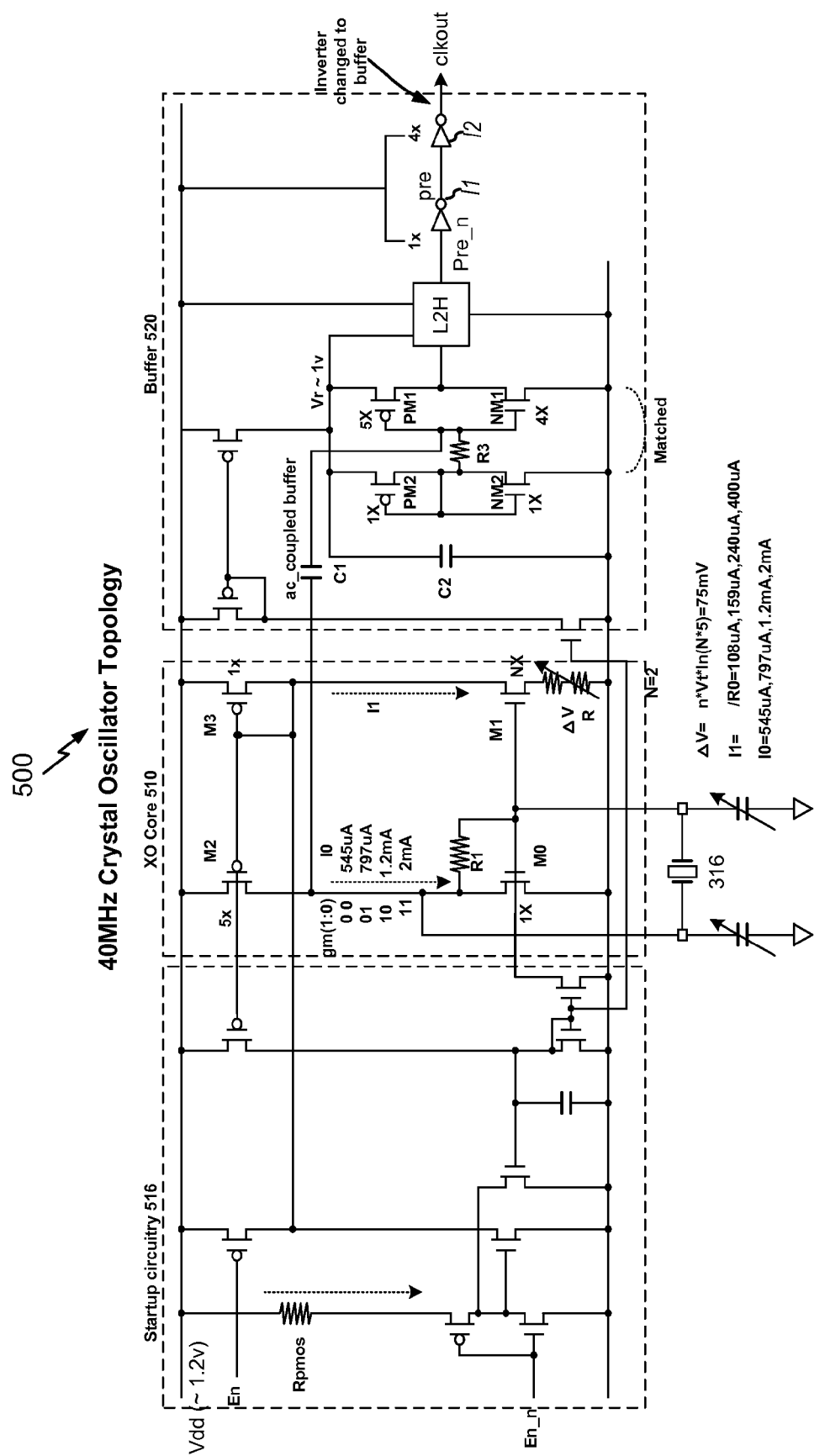
FIG. 5 illustrates another exemplary crystal oscillator circuit 500 according to one or more aspects of the present disclosure.

FIG. 5 illustrates a more complete exemplary crystal oscillator circuit 500 according to one or more aspects of the present disclosure. The crystal oscillator circuit 500 includes a startup circuitry 516, a XO core 510 and a buffer 520. The XO core 510 may be similar to the XO core 300 of FIG. 3. The startup circuitry 516 may include logic circuits comprising a set of transistors and one or more resistors, Rpmos. One or more of the transistors in the startup circuitry 516 may be enabled by signals En and En_n. The startup circuitry 516 may be configured to startup or turn on transistors of the XO core 510 to initiate the oscillation of the crystal 316. As noted, the output of the XO core 510 is initially zero upon power-up of the crystal oscillator circuit 500.

The XO core 510 includes a pair of back to back current sources connected together, a variable resistor R2 304, a resistor R1 302 across the drain and gate of the transistor M0 as well as across terminals of the crystal 316. Similar to the XO core 300, the current sources of the XO core 510 may include transistors M0, M1, M2 and M3. The transistor M0 provides a transconductance, gm, for oscillation. An output of the XO core 510 may be defined as the voltage at the drain of the transistor M0. The output of the XO core 510 is ac-coupled to an analog to clock conversion circuit within the buffer 520. The analog to clock conversion may be implemented in a number of different ways. For example, the input of the XO core 510 is ac-coupled to an inverter (made up of transistors NM1 and PM1) biased by a pair of diodes connected/coupled to NMOS transistor (NM2) and PMOS transistor (PM2) through a large resistor R3 in the buffer 520. The pair of diodes connected together create a voltage when fed from a current source that also becomes the supply voltage for the inverter (PM1, NM1). The voltage is approximately equal to the sum of P and N MOS thresholds (Vr~1V). The output of the inverter may be level-shifted to the XO core voltage (~1.2V) via a low to high voltage circuit.

As noted, the resistance of the variable resistor R2 304 as well as transistors M1 and M2 can be adjusted based on control signals from the RDY generator 130 and/or from the control device 140. In one aspect, the variable resistor R2 304 as well as the transistor M1 or M2 may be programmable to vary the transconductance, gm, of the transistor M0. The transistor M1 or M2 as well as the variable resistor R2 may be programmable in multiple steps each to allow for different settings of the transconductance, gm. Although FIG. 5 illustrates four different settings of the transconductance, gm, (e.g., gm (00), gm (01), gm (10), gm (11)), the settings may be more than four or less than four so long as the settings are configured to adjust the transconductance, gm, to reduce the time for the oscillation to settle to its final steady state.

As noted the buffer 520 includes the analog to clock conversion circuit that includes P and N MOS devices, such as NMOS transistors (NM1 and NM2) and PMOS transistors (PM1 and PM2), a resistor R3 and capacitors (C1 and C2). The buffer 520 may also include a level shifter, e.g., L2H, as well as inverters I1 and I2. Because the control signals may be subject to level shifting to correspond to the configuration of output drivers (e.g., 104 and 106) an output (e.g., clkout) of the crystal oscillator circuit 500 is converted back to the core voltage (e.g., Vdd) levels by the level shifter L2H. The ratios of P and N MOS devices are purposely skewed to yield a desired output of the crystal oscillator circuit 500 at startup, such as a high in this example, clkout (i.e., clkout equal to "1" or complimentary signal, pre, equal to "0") at startup. For example, the NMOS devices are in the ratio of 1:4 (i.e., NM2:NM1) while the PMOS devices are in a ratio of 1:5 (PM2:PM1). Accordingly, transistor PM1 is stronger than NM1 can accept. Thus Pre_n and clkout go high, while pre goes low.

In one or more aspects of the disclosure, complementary signals, pre and pre_n are forwarded to the RDY generator, which is configured to generate a control signal, e.g., rdy signal 154, for the XO core 510. The rdy signal 154 may also correspond to a steady state reliability signal to indicate that the output, clkout, of the crystal oscillator circuit 500 is steady and reliable. The rdy signal 154 may be based on the output from the buffer 520, and/or the complimentary signals pre and pre_n (discussed with reference to FIGS. 5 and 6). The complimentary signal, pre, is initially "0," which causes the capacitor C3 (discussed with reference to FIGS. 5 and 6) to be discharged to ground. As oscillation builds up, the duty cycle seen at "pre" begins to increase from zero initially, and when it reaches a desirable or pre-determined value, a comparator (such as comparator CMP of FIG. 6) triggers and assert "rdy"=1 (i.e., assert the rdy signal 154) indicating a stable operation of the crystal oscillator circuit 500. The comparator may be within an RDY generator, such as the RDY generator 130 of FIG. 1. As noted the features of the disclosure allows for indication of a stable operation even before the oscillator settles into a final frequency and amplitude. In one or more aspects of the disclosure, the rdy signal 154, is asserted when the output of the crystal oscillator circuit builds up to a duty cycle that is greater than a predefined threshold value, e.g., duty cycle>40%. Once asserted, the rdy signal 154 remains asserted until the duty cycle falls below 30% or some other predefined threshold value.

RDY Generation

Figure 6:
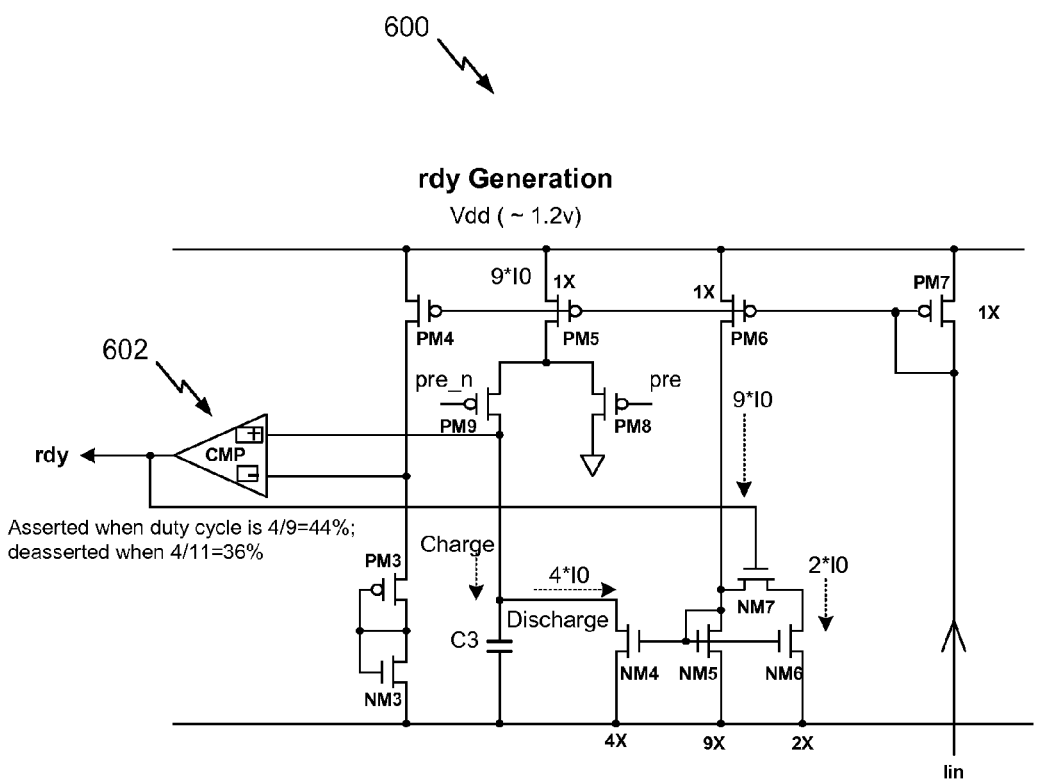
FIG. 6 illustrates an exemplary rdy generation circuit according to one or more aspects of the present disclosure.

FIG. 6 illustrates an exemplary RDY generation circuit 600 according to one or more aspects of the present disclosure.

The RDY generation circuit 600 may be implemented in the RDY generator 130 of FIG. 1. In one aspect of the disclosure, the RDY generation circuit 600 includes a comparator 602 as well as P and N MOS devices, such as NMOS transistors (NM3-NM7) and PMOS transistors (PM3 and PM9), and a capacitor, C3. The NMOS and PMOS devices are configured according to a set of ratios to allow the RDY generation circuit 600 to generate control signals that indicate a stable operation even before the crystal 316 settles into a final frequency and amplitude. The ratios of transistor sizes, NM4, NM5, NM6 and PM5, PM6 dictate the duty cycle thresholds for asserting and de-asserting the rdy signal. The current, Iin, entering the RDY generation circuit 600 may be defined as 9*I0 (e.g., 9 micro amperes) as an example in an aspect of the present disclosure.

In one aspect of the disclosure, the current flowing through the transistors PM5 and PM6 are 9*I0. When the signal, pre, is low corresponding to the duty cycle of zero, as is the case at an onset of the oscillation, the current through PM5 flows entirely into PM 8 and thus the capacitor, C3, is discharged by the drain current of NM4 to zero (ground). This causes Rdy to be low (or de-asserted) and the transistor NM7 to be turned off. All of the current (9*I0) from the transistor PM6 flows in to the transistor NM5. The drain of transistor NM4 is at zero when the capacitor C3 is fully discharged to zero. Alternately, if pre is high, which corresponds to a duty cycle of "1", all of the current through the transistor PM5 flows through the transistor PM9 and charges C3 gradual toward a voltage of Vdd. As the voltage across C3 increases, the transistor NM4, begins to conduct current and increases to a current of 4*I0. Thus, there is a net current of 5*I0 (i.e., (9−4)*I0) that is used to charge C3. An equilibrium is attained when the voltage across C3 is high enough to reduce the current at the transistor PM5 to 4*I0. With the duty cycle, a, defined as the percentage of one clock period while "pre" is high and "pre_n" is low, that is between zero and one, the charge deposited to the capacitor, C3, in one period is $\alpha*9*I0$, while the charge removed is 4*I0. When the net charge deposited exceeds the charge removed, the voltage across the capacitor, C3, begins to build up or accumulate. Accordingly, the voltage across the capacitor, C3, begins to increase when the charge deposited to the capacitor is greater than the charge removed or discharged from the capacitor, C3 (i.e., when $\alpha*9*I0>4*I0$). In this case, solving for $\alpha$ results in $\alpha>4/9=0.44$ or 44% duty cycle. As a result, an indicator corresponding to the rdy signal 154 or the rdy signal 154 is asserted when the duty cycle of the output (e.g., clkout) signal from the buffer 520 exceeds 44%. When the rdy signal 154 is asserted, NM7 is turned on, thereby reducing the discharge current to $\{4/(9+2)\}*9*I0=3.3*I0$. Accordingly, the rdy signal 154 may be de-asserted when $\alpha*9*I0<3.3*I0$, or when $\alpha<0.37$ (37%). In one or more aspects of the disclosure, XO_RF is forced to a low when the rdy signal 154 is inactive or de-asserted. The XO_RF signal may transition to a continuous clock in a glitchless manner when the rdy signal 154 is active or asserted.

Crystal Oscillator Circuit

Figure 7:
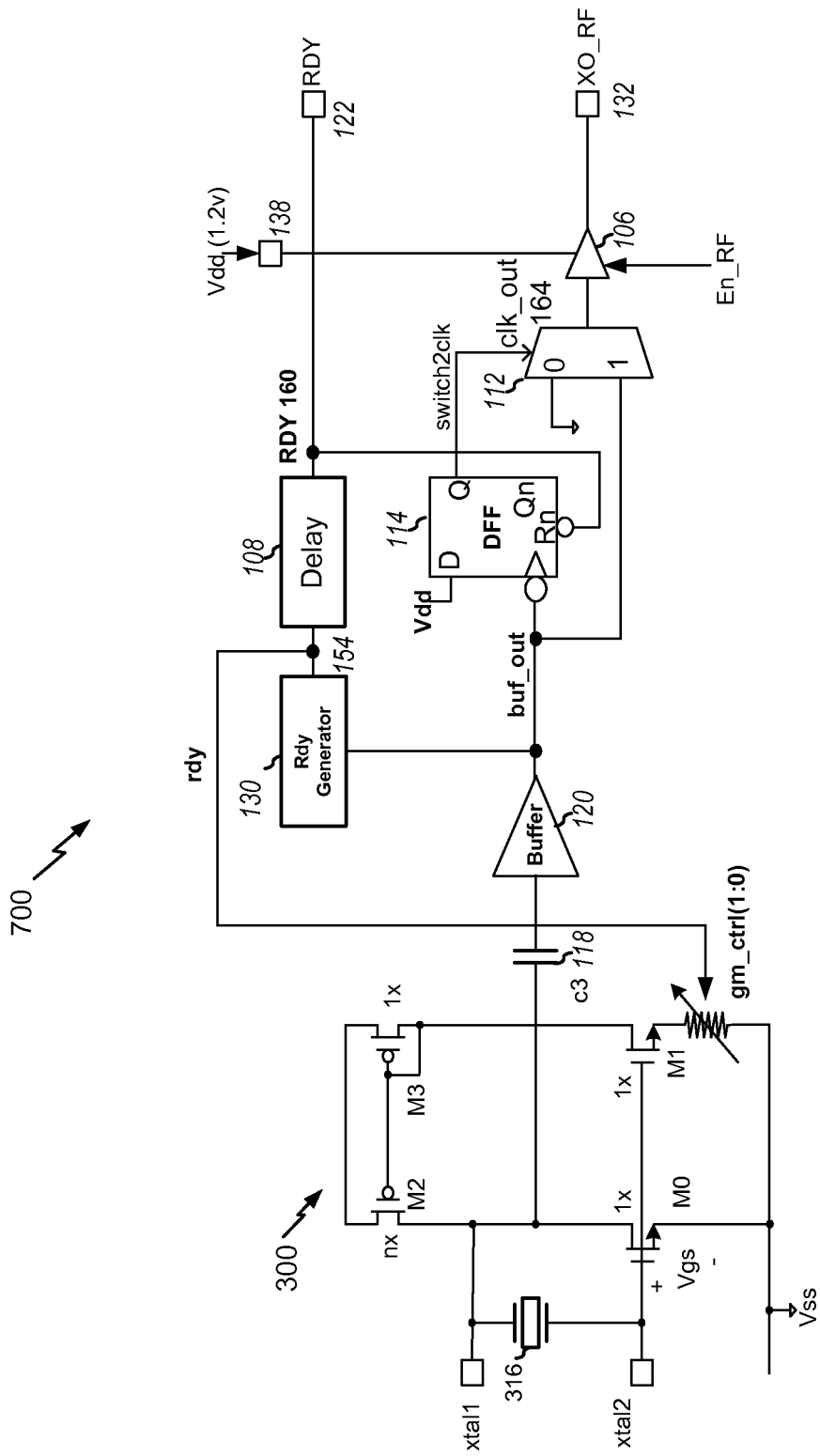
FIG. 7 is exemplary crystal oscillator circuit for clock generation according to one or more aspects of the present disclosure.

FIG. 7 is exemplary crystal oscillator circuit 700 illustrating clock generation implementation according to one or more aspects of the present disclosure.

The crystal oscillator circuit 700 incorporates features of the crystal oscillator circuit 100 of FIG. 1 and features of the XO core 300, and is therefore labeled accordingly for illustrative purposes. For example, similar to FIG. 3, the crystal oscillator circuit 700 includes XO core 300. Further, similar to FIG. 1, the crystal oscillator circuit 700 includes a Rdy generator 130, a delay block 108, a DFF 114, multiplexer 112, buffer 120 and output drivers 106.

According to one or more aspects of the present disclosure, initially, the rdy signal 154 and RDY signal 160 are reset to zero upon power-up of the crystal oscillator circuit 700. As a result, the DFF 114 is reset, which causes the switch2clk signal 162 at the output of the DFF 114 to be set to "0." Because the switch2clk signal 162 controls the multiplexer 112, the output of the multiplexer, clk_out signal 164, is also at "0" when the switch2clk signal 162 is "0." When the rdy signal 154 becomes active or high, i.e., when the RDY generator 130 determines that the duty cycle of the crystal oscillator (e.g., buf_out signal 156) is greater than a predetermined threshold, a control signal, e.g., gm_ctrl, based on the rdy signal 154 is forwarded to the XO core 300, to adjust the transconductance, gm of the XO core 300. The output of the XO core 300 is ac-coupled, via a capacitor C3 118, to an analog to clock conversion circuit within the buffer 120. The output of the buffer 120 is forwarded to the RDY generator 130, which monitors the duty cycle of the buffer output signal, buf_out. The buf_out signal 156 is based on the output of the XO core 300. When the duty cycle of the buffer output signal, buf_out, meets or is greater than a predefined threshold, the rdy signal 154 becomes active or asserted and a control signal based on the rdy signal 154 is looped back into the XO core 300. As already described, the control signal may be configured to vary the resistance of the variable resistor R2 304 or the sizes of the transistors M1 and M2 with a net effect a change in the transconductance, gm, of the XO core 300. Because the change in the transconductance, gm, generates a disturbance to XO core, which may result in glitches, the rdy signal 154 is delayed by the delay block 108 to become "RDY", 160, before being forwarded to a "force reset bar Rn" input of DFF 114. After Rn is released (e.g., increased to a high by the delayed rdy signal 160) DFF is free to respond to the "D" input on a next falling edge of buf_out. Thus, the Q output of DFF transitions to a high, which corresponds to the switch2clk signal 162. The switch2clk signal 162 is used to switch the mux position from "0" to "1."

Crystal Oscillator Output Waveforms

Figure 8:
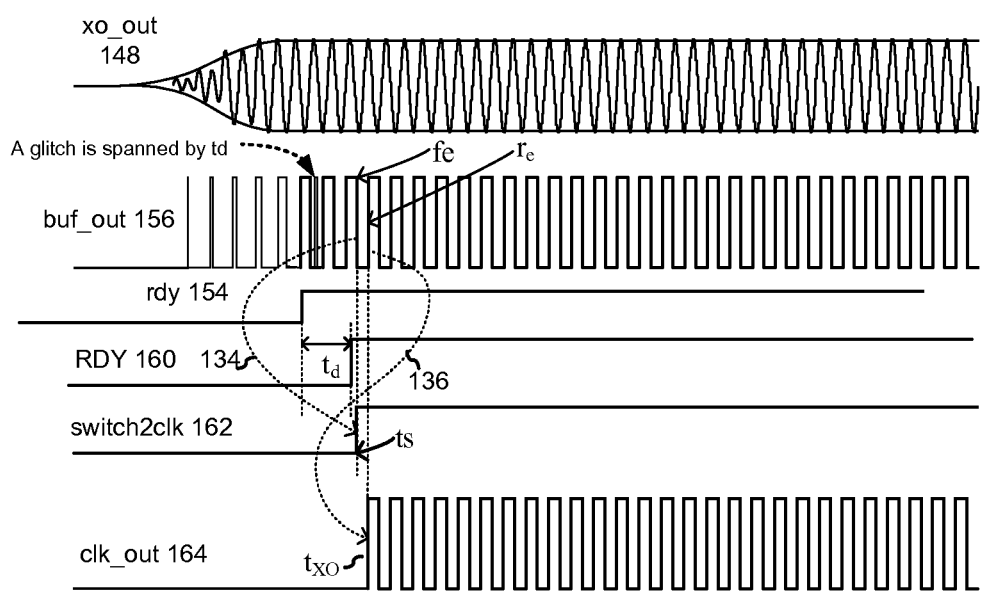
FIG. 8 illustrates an exemplary waveform outputted at various terminals on the crystal oscillator circuit of FIG. 7 according to one or more aspects of the present disclosure.

Similar to the exemplary waveforms of FIG. 2, FIG. 8 illustrates exemplary waveforms defined at various terminals of the crystal oscillator circuit of FIG. 1.

In the exemplary waveforms of FIG. 8, however, the XO_RF signal is replaced with the clk_out signal 164, to illustrate the relationship of the clk_out signal 164 with the other signals in the exemplary waveforms. Similar to the XO_RF signal, the clk_out signal 164 is initiated at time, $t_{XO}$, illustrated in FIG. 8, at a rising edge, $r_e$, of the buf_out waveform, which follows the falling edge, $f_e$, of the buf_out waveform. As illustrated by the waveforms of FIG. 8, the switch2clk signal 162 becomes "1" on the falling edge of buf_out signal 156. On the next rising edge of buf_out signal 156, the clk_out signal 164 transitions to "1". From thereon, XO_RF is active. Prior to the rdy signal 154 being active, the XO_RF signals are held at a low.

Gearshift Process Flow

Figure 9:
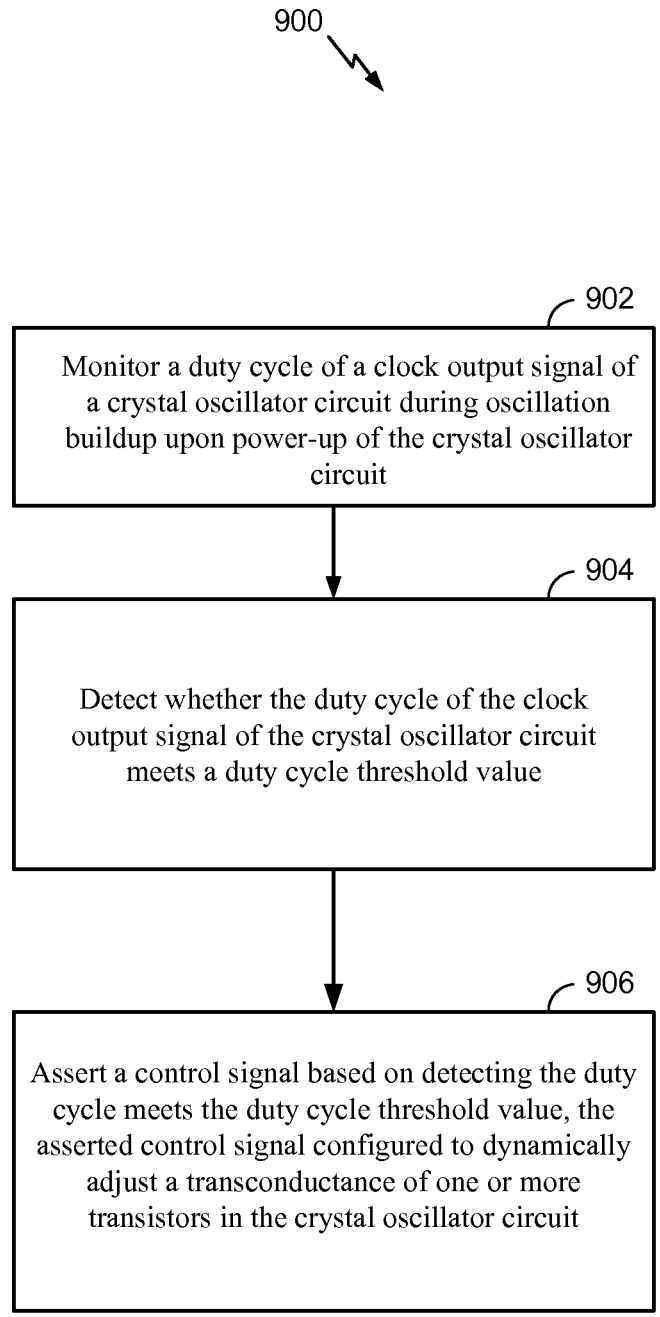
FIG. 9 illustrates a method for gearshifting during oscillation buildup of a crystal in a crystal oscillator in accordance with one or more aspects of the disclosure.

FIG. 9 illustrates a method for automatic gearshifting during oscillation buildup of a crystal in a crystal oscillator in accordance with one or more aspects of the disclosure.

As shown in FIG. 9, a device in the radio access technology chip, that may be the RDY generator 130 or the RDY generation circuit 600, may monitor a duty cycle of a clock output signal of a crystal oscillator circuit during oscillation buildup upon power-up of the crystal oscillator circuit, as shown in block 902. In one aspect, the clock output signal may be the buf_out signal 156 at an output of the buffer 120/520. In block 904, the RDY generator 130 or the RDY generation circuit 600 detect whether the duty cycle of the clock output signal of the crystal oscillator circuit meets a duty cycle threshold value. In block 906, the RDY generator 130 or the RDY generation circuit 600 may assert a control signal when the duty cycle exceeds a threshold value. The asserted control signal may be configured to dynamically adjust a transconductance of one or more transistors in the crystal oscillator circuit.

In some aspects of the disclosure, the RDY generator 130 or the RDY generation circuit 600 includes a monitoring device configured to monitor a duty cycle of a clock output signal of a crystal oscillator circuit during oscillation buildup upon power-up of the crystal oscillator circuit. The RDY generator 130 or the RDY generation circuit 600 also includes a detecting device configured to detect whether the duty cycle of the clock output signal of the crystal oscillator circuit meets a duty cycle threshold value. The RDY generator 130 or the RDY generation circuit 600 may further include an assertion device configured to assert a control signal based on detecting the duty cycle meets the duty cycle threshold value. The asserted control signal configured to dynamically adjust a transconductance of one or more transistors in the crystal oscillator circuit.

CONCLUSION AND ALTERNATE ASPECTS OF THE DISCLOSURE

Although specific circuitry has been set forth, it will be appreciated by those skilled in the art that not all of the disclosed circuitry is required to practice the disclosed embodiments. Moreover, certain well known circuits have not been described, to maintain focus on the disclosure.

The methodologies described herein may be implemented by various means depending upon the application. For example, these methodologies may be implemented in hardware, firmware, software, or any combination thereof. For a hardware implementation, the processing units may be implemented within one or more application specific integrated circuits (ASICs), digital signal processors (DSPs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine or computer readable medium tangibly embodying instructions may be used in implementing the methodologies described herein. For example, software code may be stored in a memory and executed by a processor. When executed by the processor, the executing software code generates the operational environment that implements the various methodologies and functionalities of the different aspects of the teachings presented herein. Memory may be implemented within the processor or external to the processor. As used herein, the term "memory" refers to any type of long term, short term, volatile, nonvolatile, or other memory and is not to be limited to any particular type of memory or number of memories, or type of media upon which memory is stored.

Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium.

The machine or computer readable medium that stores the software code defining the methodologies and functions described herein includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. As used herein, disk and/or disc includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

The computer-readable medium may be embodied in a computer-program product. By way of example, a computer-program product may include a computer-readable medium in packaging materials. Those skilled in the art will recognize how best to implement the described functionality presented throughout this disclosure depending on the particular application and the overall design constraints imposed on the overall system.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

Although the present teachings and their advantages have been described in detail, it should be understood that various changes, substitutions and alterations can be made herein without departing from the technology of the teachings as defined by the appended claims. Moreover, the scope of the present application is not intended to be limited to the particular aspects of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding aspects described herein may be utilized according to the present teachings. Accordingly, the appended claims are intended to include within their scope such processes, machines, manufacture, compositions of matter, means, methods, or steps.

The description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, in which reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b;

c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The foregoing description of one or more embodiments or aspects of the present disclosure has been presented for the purposes of illustration and description. It is not intended to be exhaustive or to limit the disclosure or the invention to the precise form disclosed. Many modifications and variations are possible in light of the above teaching. Although the present disclosure and invention has been described in connection with certain embodiments, it is to be understood that modifications and variations may be utilized without departing from the principles and scope of the disclosure or invention, as those skilled in the art will readily understand. Accordingly, such modifications would be practiced within the scope of the disclosure and invention, and within the scope of the following claims or within the full range of equivalents of the claims.

Further, the attached claims are presented merely as one aspect of the present invention. No disclaimer is intended, expressed, or implied for any claim scope of the present invention through the inclusion of this or any other claim language that is presented herein or may be presented in the future. Any disclaimers, expressed or implied, made during prosecution of the present application regarding the claims presented, changes made to the claims for clarification, or other changes made during prosecution, are hereby expressly disclaimed for at least the reason of recapturing any potential disclaimed claim scope affected by presentation of specific claim language during prosecution of this and any related applications. Applicant reserves the right to file broader claims, narrower claims, or claims of different scope or subject matter, in one or more continuation or divisional applications in accordance within the full breadth of the present disclosure, and the full range of doctrine of equivalents of the present disclosure, as recited in this specification.

What is claimed is:

1. An apparatus comprising:
   a monitoring device configured to monitor a duty cycle of a clock output signal of a crystal oscillator circuit during oscillation buildup upon power-up of the crystal oscillator circuit, the duty cycle being output from a buffer with a ratio of a first p-type metal-oxide-semiconductor (PMOS) transistor to a second PMOS transistor that is different from a ratio of a first n-type metal-oxide-semiconductor (NMOS) transistor to a second NMOS transistor to condition the duty cycle to have an initial value that does not meet a duty cycle threshold value at the power-up, and a value of the duty cycle being adjusted from the initial value during the oscillation buildup;
   a detecting device configured to detect whether the duty cycle of the clock output signal of the crystal oscillator circuit meets the duty cycle threshold value; and
   an assertion device configured to assert a control signal based on detecting the duty cycle meets the duty cycle threshold value, the asserted control signal configured to dynamically adjust a transconductance of the crystal oscillator circuit.

2. The apparatus of claim 1, in which the asserted control signal is configured to adjust the transconductance of the crystal oscillator circuit if the duty cycle meets the duty cycle threshold value.

3. The apparatus of claim 1, further comprising a delay device configured to delay the asserted control signal, the delayed asserted control signal configured to facilitate generation of a glitch-less clock output signal based on detecting the duty cycle meets the duty cycle threshold value.

4. The apparatus of claim 3, in which the asserted control signal is delayed to correspond to a time when a stable operation of the crystal oscillator circuit is initiated.

5. The apparatus of claim 3, in which the asserted control signal is delayed from a time that the crystal oscillator circuit is powered up.

6. The apparatus of claim 1, in which the assertion device is further configured to generate programmable thresholds for dynamically adjusting the transconductance of the crystal oscillator circuit.

7. The apparatus of claim 1, in which the duty cycle is initially set to zero.

8. The apparatus of claim 1, in which the initial value is zero or one.

9. A method comprising:
   monitoring a duty cycle of a clock output signal of a crystal oscillator circuit during oscillation buildup upon power-up of the crystal oscillator circuit, the duty cycle being output from a buffer with a ratio of a first p-type metal-oxide-semiconductor (PMOS) transistor to a second PMOS transistor that is different from a ratio of a first n-type metal-oxide-semiconductor (NMOS) transistor to a second NMOS transistor to condition the duty cycle to have an initial value that does not meet a duty cycle threshold value at the power-up, and a value of the duty cycle being adjusted from the initial value during the oscillation buildup;
   detecting whether the duty cycle of the clock output signal of the crystal oscillator circuit meets the duty cycle threshold value; and
   asserting a control signal based on detecting the duty cycle meets the duty cycle threshold value, the asserted control signal configured to dynamically adjust a transconductance of one or more transistors in the crystal oscillator circuit.

10. The method of claim 9, in which the asserted control signal adjusts the transconductance of the crystal oscillator circuit if the duty cycle meets the duty cycle threshold value.

11. The method of claim 9, further comprising delaying the asserted control signal, the delayed asserted control signal configured to facilitate generation of a glitch-less clock output signal based on detecting if the duty cycle meets the duty cycle threshold value.

12. The method of claim 11, in which the asserted control signal is delayed to correspond to a time when a stable operation of the crystal oscillator circuit is initiated.

13. The method of claim 11, in which the asserted control signal is delayed from a time that the crystal oscillator circuit is powered up.

14. The method of claim 9, further comprising generating programmable thresholds for dynamically adjusting the transconductance of the crystal oscillator circuit.

15. The method of claim 9, in which the initial value is zero or one.

16. The method of claim 9, in which the duty cycle is initially set to zero.

17. An apparatus comprising:
- means for monitoring a duty cycle of a clock output signal of a crystal oscillator circuit during oscillation buildup upon power-up of the crystal oscillator circuit;
- means for detecting whether the duty cycle of the clock output signal of the crystal oscillator circuit meets a duty cycle threshold value; and
- means for asserting a control signal based on detecting the duty cycle meets the duty cycle threshold value, the asserted control signal configured to dynamically adjust a transconductance of the crystal oscillator circuit.

18. The apparatus of claim 17, further comprising means for delaying the asserted control signal, the delayed asserted control signal configured to facilitate generation of a glitchless clock output signal based on detecting the duty cycle meets the duty cycle threshold value.

* * * * *